United States Patent
Doyle et al.

(10) Patent No.: US 8,030,197 B2
(45) Date of Patent: Oct. 4, 2011

(54) RECESSED CHANNEL ARRAY TRANSISTOR (RCAT) IN REPLACEMENT METAL GATE (RMG) LOGIC FLOW

(75) Inventors: Brian S. Doyle, Portland, OR (US); Gilbert Dewey, Hillsboro, OR (US); Ravi Pillarisetty, Portland, OR (US); Nick Lindert, Beaverton, OR (US); Uday Shah, Portland, OR (US); Dinesh Somasekhar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 75 days.

(21) Appl. No.: 12/435,382

(22) Filed: May 4, 2009

(65) Prior Publication Data
US 2010/0276757 A1 Nov. 4, 2010

(51) Int. Cl.
*H01L 21/3205* (2006.01)
*H01L 21/4763* (2006.01)
(52) U.S. Cl. .......... 438/589; 438/270; 257/368
(58) Field of Classification Search .......... 438/270; 257/334, E27.616
See application file for complete search history.

(56) References Cited

U.S. PATENT DOCUMENTS

| 7,728,373 | B2 * | 6/2010 | Seo et al. ............ 257/306 |
| 2004/0180501 | A1 * | 9/2004 | Liu ................ 438/275 |
| 2005/0189598 | A1 * | 9/2005 | Jang et al. ............ 257/400 |
| 2006/0030117 | A1 * | 2/2006 | Ko et al. ............ 438/421 |
| 2008/0135943 | A1 * | 6/2008 | Chien ............ 257/369 |
| 2009/0011537 | A1 * | 1/2009 | Shimizu et al. ............ 438/104 |
| 2009/0104742 | A1 * | 4/2009 | Pas ................ 438/230 |
| 2009/0127609 | A1 * | 5/2009 | Han et al. ............ 257/311 |
| 2009/0242980 | A1 * | 10/2009 | Inoue ............ 257/334 |
| 2010/0013047 | A1 * | 1/2010 | Thies et al. ............ 257/532 |
| 2010/0102394 | A1 * | 4/2010 | Yamakawa et al. ............ 257/369 |

* cited by examiner

*Primary Examiner* — Phuc Dang
(74) *Attorney, Agent, or Firm* — Winkle, PLLC

(57) ABSTRACT

Embodiments of the invention relate to a method of fabricating logic transistors using replacement metal gate (RMG) logic flow with modified process to form recessed channel array transistors (RCAT) on a common semiconductor substrate. An embodiment comprises forming an interlayer dielectric (ILD) layer on a semiconductor substrate, forming a first recess in the ILD layer of a first substrate region, forming a recessed channel in the ILD layer and in the substrate of a second substrate region, depositing a first conformal high-k dielectric layer in the first recess and a second conformal high-k dielectric layer in the recessed channel, and filling the first recess with a first gate metal and the recessed channel with a second gate metal.

20 Claims, 4 Drawing Sheets

RECESSED CHANNEL ARRAY TRANSISTOR (RCAT) IN REPLACEMENT METAL GATE (RMG) LOGIC FLOW

FIELD

Embodiments of the invention relate to a recessed channel array transistor (RCAT) in a replacement metal gate (RMG) logic process flow. More particularly, embodiments of the invention relate to a method of forming a RCAT in a RMG process flow for a logic transistor.

BACKGROUND

Modern semiconductor devices are typically packed with higher density of transistors and transistors with shorter channel (gate) lengths to increase the operating speed and performance of the devices. Short channel effects exhibited by modern semiconductor devices typically limit the performance of the devices. Transistors with higher channel lengths are typically designed to mitigate the short channel effects and off-current leakage. However, such design typically requires larger pitch size between transistors and compromises high die area utilization.

Recessed channel array transistors (RCAT) have typically been used where low leakage or low variation of current leakage is critical, such as in analog and memory devices. A RCAT typically demonstrates better short channel effects relative to conventional transistors, such as non-planar (logic) and multi-gate transistor devices. Compared to a conventional transistor having the same layout gate lengths a RCAT typically includes a longer effective gate length, and significantly lower subthreshold slope (SS) and drain-induced barrier lowering (DIBL) voltages, hence lower off-current leakage and a more controllable voltage variation.

BRIEF DESCRIPTION OF THE DRAWINGS

Embodiments of the invention are illustrated by way of example and not limitation in the figures of the accompanying drawings, in which like references indicate similar elements.

DETAILED DESCRIPTION

Embodiments of the invention relate to a method of fabricating logic transistors using replacement metal gate (RMG) logic flow with modified process to form recessed channel array transistors (RCAT) on a common semiconductor substrate. Embodiments of the invention allow both logic transistors as well as RCATs to be formed on a semiconductor substrate without occupying additional surface area. Hence, a RCAT having the same layout gate length with a logic transistor will have an effective gate length longer than the gate of length of the logic transistor.

An embodiment of the method comprises forming an interlayer dielectric (ILD) layer on a semiconductor substrate, forming a first recess in the ILD layer of a first substrate region, forming a recessed channel in the ILD layer and in the substrate of a second substrate region, depositing a first conformal high-k dielectric layer in the first recess and a second conformal high-k dielectric layer in the recessed channel, and filling the first recess with a first gate metal and the recessed channel with a second gate metal.

Another embodiment of the method comprises removing a first polysilicon gate disposed on a logic transistor region of a semiconductor substrate to form a first recess, removing a second polysilicon gate disposed on a recessed channel array transistor (RCAT) region of the substrate, anisotropically etching a portion of the substrate on the RCAT region to form a recessed channel in the substrate, depositing a first conformal high-k dielectric layer in the first recess, followed by filling the first recess with a first gate metal to form a logic transistor having a layout gate length, and depositing a second conformal high-k dielectric layer in the recessed channel, followed by filling the recessed channel with a second gate metal.

Figure 1:
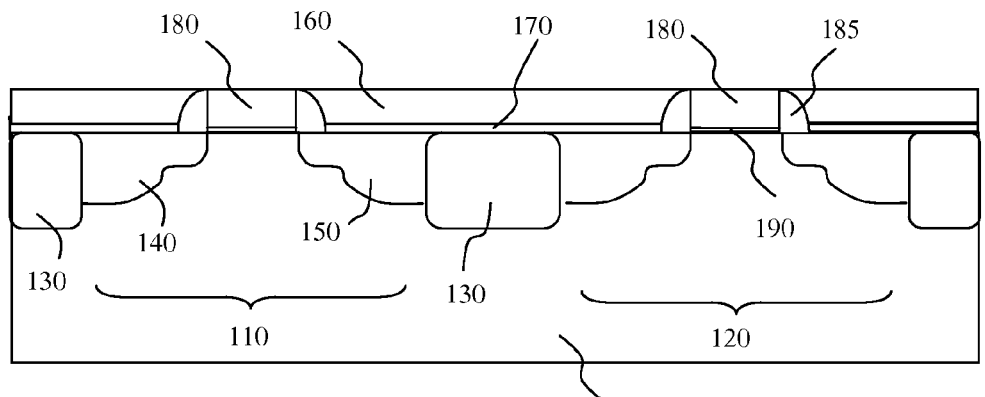
FIG. 1 is a cross-sectional view of a semiconductor substrate having adjacent transistors at an initial stage of a process according to an embodiment.

FIGS. 1-5 are cross-sectional figures of an embodiment of a method to form logic transistors and recessed channel array transistors on a semiconductor substrate. Embodiments of the invention include transistors in logic transistor region 110 having the same high-k dielectric layer and gate metal of transistors in RCAT region 120. FIG. 1 is a cross-sectional view of a semiconductor substrate having a logic transistor region and a recessed channel array transistor (RCAT) region at the initial stage of a process according to an embodiment. Semiconductor substrate 100 includes logic transistor region 110 and RCAT region 120 separated by isolation region 130. Semiconductor substrate 100 may be a semiconductor wafer made of any suitable semiconductive material, such as monocrystalline silicon, indium phosphide, gallium arsenide, gallium nitride, silicon germanium, and silicon carbide. Logic transistor region 110 and RCA region 120 each includes source region 140 and drain region 150 formed using methods well-known in the art. Source region 140 and drain region 150 may be doped with suitable N-type or P-type implants to create N-type or P-type regions using methods well-known in the art. Substrate 100 includes barrier layer 170 disposed above source region 140 and drain region 150. Barrier layer 170 may be a nitride (SiN₃) layer formed using methods well-known in the art. Logic transistor region 110 and RCAT region 120 each includes polysilicon gate 180 interposed between spacers 185. Gate oxide 190 is formed between polysilicon gate 180 and top surface of substrate 100. Gate oxide 190 may be made of silicon dioxide. Spacers 185 may be made of materials well-known in the art, such as nitride oxynitride, silicon carbide, and silicon boron nitride. Interlayer dielectric (ILD) layer 160 is deposited on substrate 100 and polished using methods well-known in the art, such as chemical-mechanical planarization (CMP). ILD layer 160 may be made of any suitable insulating material, such as silicon dioxide, silicon nitride, or silicon oxynitride.

Figure 2:
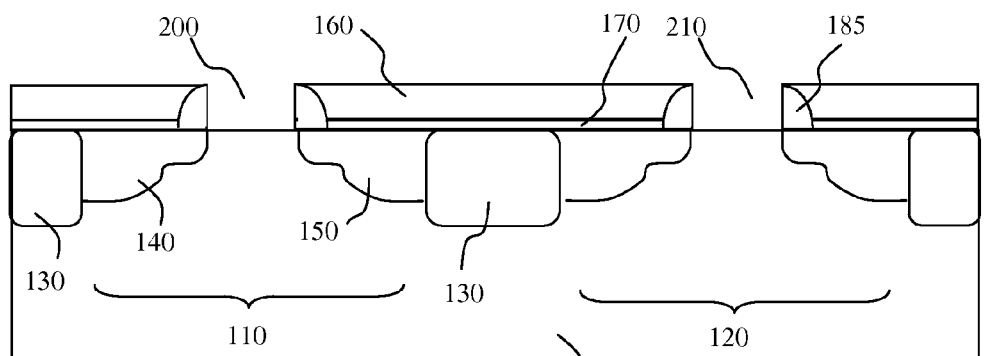
FIG. 2 is a cross-sectional view of a semiconductor substrate having polysilicon gate of respective adjacent transistors removed to form a recess according to an embodiment.

A recess is first formed on each logic transistor region 110 and RCAT region 120 by removing the respective polysilicon gates 180. FIG. 2 is a cross-sectional view of a semiconductor substrate having a logic transistor region and a RCAT region with respective polysilicon gates removed to form respective recesses according to an embodiment. Polysilicon gates 180 and gate oxide 190 in logic transistor region 110 and RCAT region 120 are selectively removed to form respective logic recess 200 and recessed channel 210. Removal of polysilicon gates 180 and gate oxide 190 can be achieved by methods known in the art. For example, dry etch (plasma etch) or wet etch, or a combination of dry and wet etch, may be used.

Figure 3:
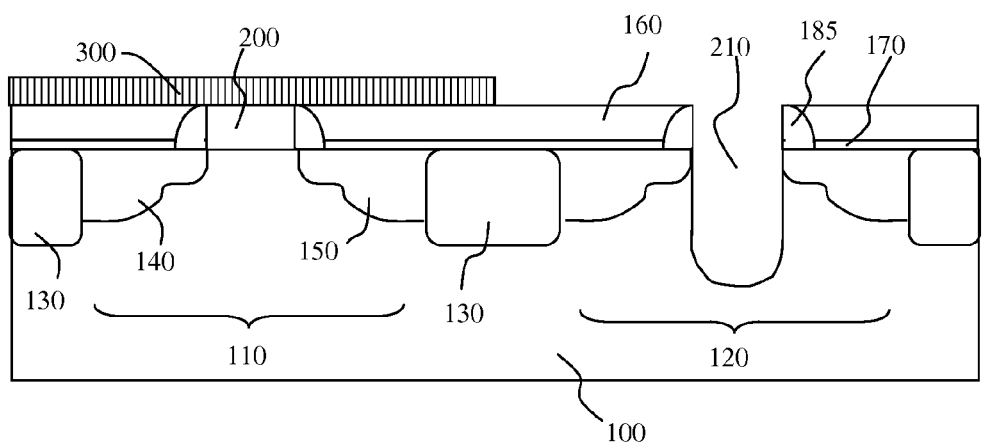
FIG. 3 is a cross-sectional view of a semiconductor substrate having a recessed channel formed in a portion of the substrate according to an embodiment.

Next, logic transistor region 110 is masked so that deep silicon etch is selectively targeted on a portion of RCAT transistor region 120. FIG. 3 is a cross-sectional view of a semiconductor substrate having a recessed channel formed in a RCAT region of the substrate. Logic transistor region 110 is masked with masking layer 300. Masking layer 300 may be any photoresist known in the art. Masking layer 300 is patterned to shield at least logic recess 200, adjacent spacers 185 and ILD layer 160 corresponding to logic transistor region 110. After masking logic transistor region 110, a deep silicon etch is performed on recessed channel 210. A portion of silicon substrate 100 is anisotropically etched to form recessed channel 210 having a recess in substrate 100 corresponding to RCAT region 120. Deep silicon etching in RCAT region 120 may be a dry etch or a combination of dry etch and wet etch. Masking layer 300 is removed after deep silicon etch in RCAT region 120.

Figure 4:
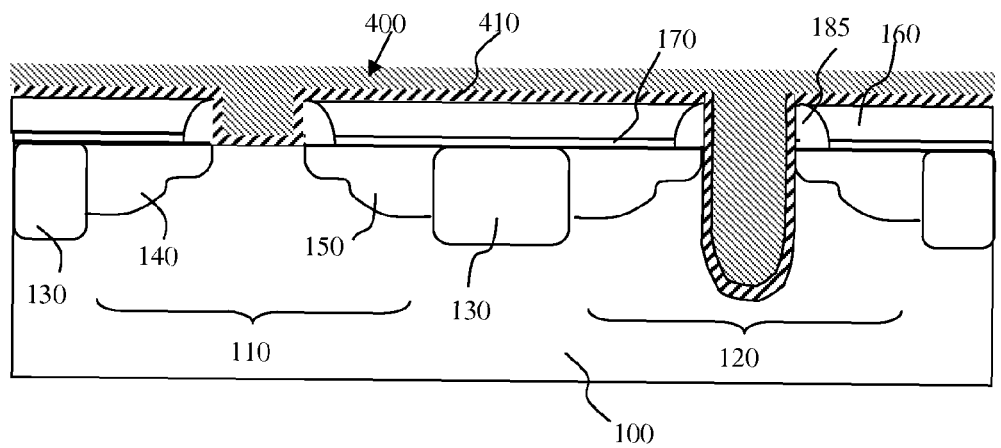
FIG. 4 is a cross-sectional view of a semiconductor substrate having a conformal high-k dielectric layer disposed in a recessed channel, followed by forming a gate metal in the recessed channel according to an embodiment.

After forming logic recess 200 and recessed channel 210 in logic transistor region 110 and RCAT region 120 respectively, the respective gate electrode in logic transistor region and RCAT region are respectively formed. FIG. 4 is a cross-sectional view of a semiconductor substrate having a conformal high-k dielectric layer disposed in a recessed channel, followed by forming a gate metal in the recessed channel according to an embodiment. A conformal high-k dielectric layer 410 is deposited on at least the sidewalls of logic recess 200 and recessed channel 210, and on ILD layer 160. After dielectric layer 410 is deposited, logic recess 200 and recessed channel 210 are filled with gate metal 400. According to an embodiment, high-k dielectric layer 410 and gate metal 400 deposited in logic recess 200 are respectively the same material as high-k dielectric layer 410 and gate metal 400 deposited in recessed channel 210. As such and according to an embodiment, depositing of high-k dielectric layer 410 in logic recess 200 and recessed channel 210 is a continuous process followed by a subsequent continuous process of filling of gate metal 400 in logic recess 200 and recessed channel 210. However, other implementations of forming gate electrode in logic transistor region 110 and RCAT region 120 are not precluded in other embodiments of the invention. For example, other embodiments may include depositing high-k dielectric layer 410 of a first uniform thickness in logic recess 200 and depositing high-k dielectric layer 410 of a second uniform thickness in recessed channel 210 having a different thickness from the first thickness.

High-k dielectric layer 410 includes any oxide of a material having a dielectric constant (k) higher than the dielectric constant of silicon dioxide. High-k dielectric 410 also includes any materials capable of minimizing gate leakage, such as, but not limited to, hafnium oxide, hafnium silicon oxide, lanthanum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium oxide, and lead zinc niobate. High-k dielectric layer 410 may be deposited using any method well-known in the art to yield a conformal layer, such as, but not limited to, atomic layer deposition (ALD) and various implementations of chemical vapor deposition (CVD), such as atmospheric pressure CVD (APCVD), low pressure CVD (LPCVD), and plasma enhanced CVD (PECVD).

Gate metal 400 includes any conductive metal-based material having a high tolerance to a high temperature range, for example temperatures exceeding 900° C. Examples of materials suitable for fabricating gate metal 400 include, but are not limited to, tungsten, copper, ruthenium, cobalt, chromium, iron, palladium, molybdenum, tantalum, manganese, vanadium, gold, silver, and niobium. Metal alloys comprising said metals may be used to fabricate gate metal 400 as well. Less conductive metal carbides, such as titanium carbide, zirconium carbide, tantalum carbide, tungsten carbide, and tungsten carbide, may also be used to form gate metal 400. Gate metal 400 may also be made from a metal nitride, such as titanium nitride and tantalum nitride, or a conductive metal oxide, such as ruthenium oxide. Various known methods may be used to form gate metal 400 in logic recess 200 and recessed channel 210. For example, gate metal 400 may be formed by way of a chemical process, such as atomic layer deposition (ALP) and chemical vapor deposition (CVD). Alternatively, an electroplating method is used to first form a metal seed layer on the sidewalls of logic recess 200 and recessed channel 210 and then grow gate metal 400 to completely fill logic recess 200 and recessed channel 210. For another example, an electroless plating method is used. Other physical processes, such as physical vapor deposition (PVD) (also known as sputtering) may be used.

Devices fabricated in logic transistor region 110 and RCAT region 120 may be designed to have different electronic performance or properties. Although gate metal 400 for transistors in logic transistor region 110 may be of the same material as gate metal 400 for recessed channel array transistors in RCAT region 120, the work function of the transistors may be altered. Various methods may be used to alter the work function of the transistors. For example, for some embodiments, high-k dielectric layer 410 of transistors in logic transistor region 110 may be designed to be of different thickness with high-k dielectric layer 410 of transistors in RCAT region 120. Gate metal 400 of transistors in logic transistor region 110 may also be designed to be of different thickness with gate metal 400 of transistors in RCAT region 120. Alternatively, embodiments of the invention include depositing at least an additional layer of gate metal on at least respective gate metal 400 for transistors in logic transistor region 110 and RCAT region 120. The thickness of the additional layer of gate metal on transistors in logic transistor region 110 may be different from the thickness of the additional layer of gate metal on transistors in RCAT region 120. Gate metal 400 may be doped with small amounts of implants to modify and achieve the desired electrical properties of gate metal 400. The type and amount of implants to be introduced to gate metal 400 is a matter of design of the device. Examples of implants include, but are not limited to, boron, aluminum, gallium, indium, carbon, germanium, tin, nitrogen, phosphorus, arsenic, and antimony. Known methods of doping gate metal 400 with implants, such as thermal diffusion and ion implantation may be used.

Figure 5:
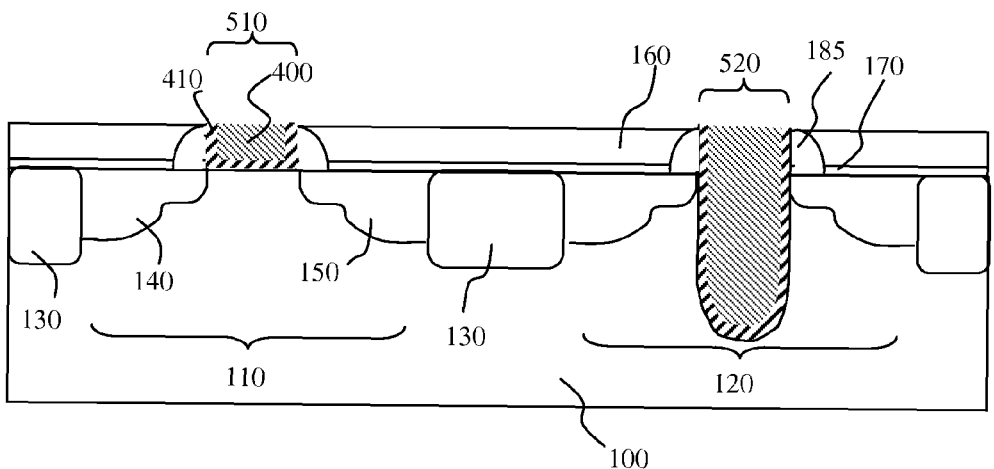
FIG. 5 is a cross-sectional view of a semiconductor substrate having a high-k dielectric layer and a gate metal formed in each of a logic transistor and a recessed channel array transistor (RCAT) according to an embodiment.

After filling logic recess 200 and recessed channel 210 with respective gate metal 400, substrate 100 is polished to planarize gate metal 400 layer in logic transistor region 110 and RCAT region 120. FIG. 5 is a cross-sectional view of a semiconductor substrate having a high-k dielectric layer and a gate metal polished according to an embodiment. High-k dielectric layer 410 and gate metal 400 formed on ILD layer 160 are polished away leaving a top surface of respective gate metal 400 in logic transistor region 110 and RCAT region 120 that is planar with ILD layer 160. Through polishing the desired thickness of gate metal 400 and ILD layer 160 is achieved, and logic transistor 510 and RCAT transistor 520 are formed. Known methods of polishing, such as chemical-mechanical planarization (CMP), may be used.

Figure 6:
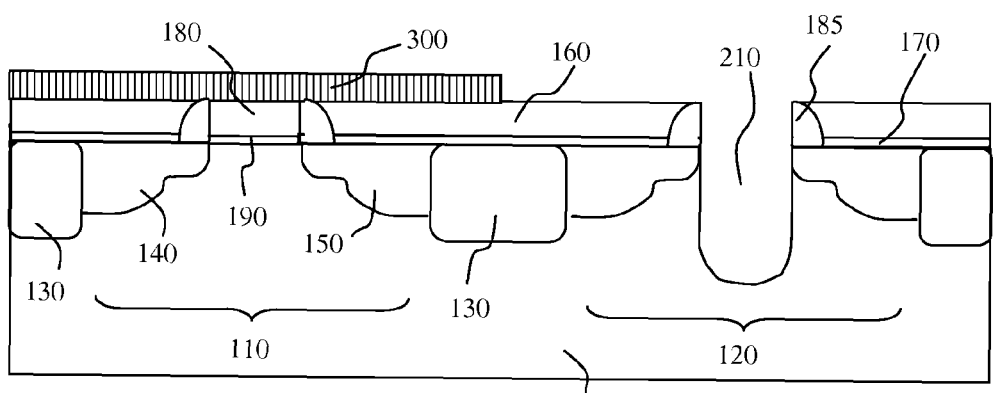
FIG. 6 is a cross-sectional view of a semiconductor substrate having a recessed channel formed according to another embodiment.

FIGS. 6-11 are cross-sectional figures of a semiconductor substrate upon which logic transistors and recessed channel array transistors are formed according to another embodiment of process. Embodiments include transistors in logic transistor region 110 having different high-k dielectric layer and/or different gate metal from high-k dielectric layer and gate metal of transistors in RCAT region 120. FIG. 6 is a cross-sectional view of a semiconductor substrate having a recessed channel formed. Logic transistor region 110 of semiconductor substrate 100 is masked by masking layer 300. Polysilicon layer 180, gate oxide 190, and a portion of substrate 100 in RCAT region 120 are removed, for example, by way of anisotropic etching to form recessed channel 210.

Figure 7:
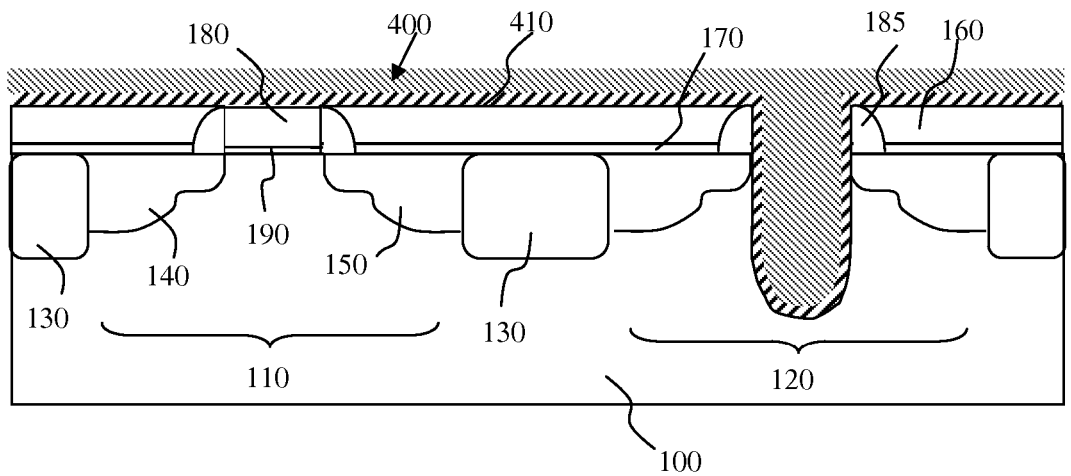
FIG. 7 is a cross-sectional view of a semiconductor substrate having a conformal high-k dielectric layer disposed in a recessed channel followed by forming a gate metal in the recessed channel according to another embodiment.

After forming recessed channel 210 in RCAT region 120, gate electrode for recessed channel array transistors in RCAT region is formed. FIG. 7 is a cross-sectional view of a semiconductor substrate having a first conformal high-k dielectric layer disposed in a recessed channel of a RCAT region, and a first gate metal filling the recessed channel according to another embodiment. After removing masking layer 300 from logic transistor region 110 (in FIG. 6), first high-k dielectric layer 410 is conformally deposited on the sidewalls of recessed channel 210 and on the surface of ILD layer 160. A portion of first high-k dielectric layer 410 corresponding to logic transistor region 110 is disposed on polysilicon layer 180 in logic transistor region 110. Subsequently, first gate metal 400 fills recessed channel 210 and a layer of first gate metal 400 is formed above the top planar surface of first high-k dielectric layer 410.

Figure 8:
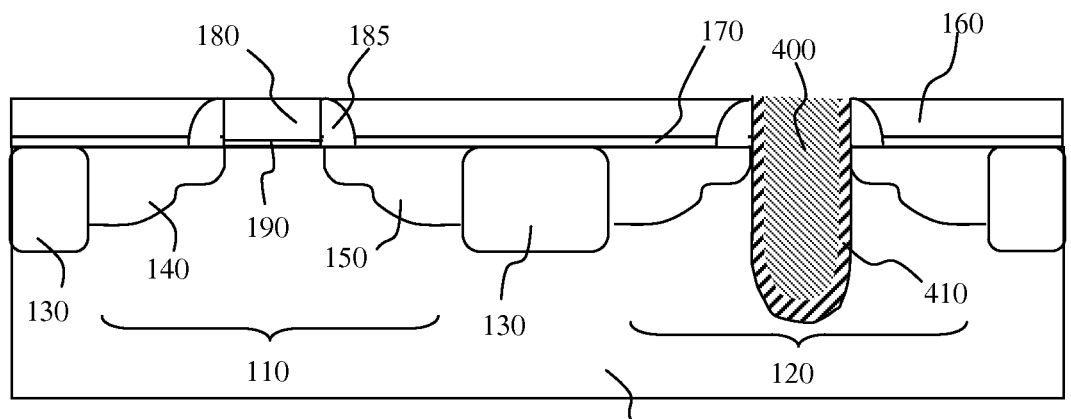
FIG. 8 is a cross-sectional view of a semiconductor substrate having a conformal high-k dielectric layer and a gate metal formed in a recessed channel array transistor (RCAT) according to another embodiment.

The layer of first gate metal 400 and first high-k dielectric layer 410 disposed on the top planar surface of substrate 100 are removed to form a recessed channel array transistor. FIG. 8 is a cross-sectional view of a semiconductor substrate having a first conformal high-k dielectric layer, and a first gate metal formed in a recessed channel of a RCAT region polished according to another embodiment. First gate metal 400 and first high-k dielectric layer 410 disposed on the top planar surface of substrate 100 may be polished by known method, such as CMP. Polishing reveals the top surface of first gate metal 400 being planar with the tips of first high-k dielectric layer 410 and the top surface of ILD layer 160.

Figure 9:
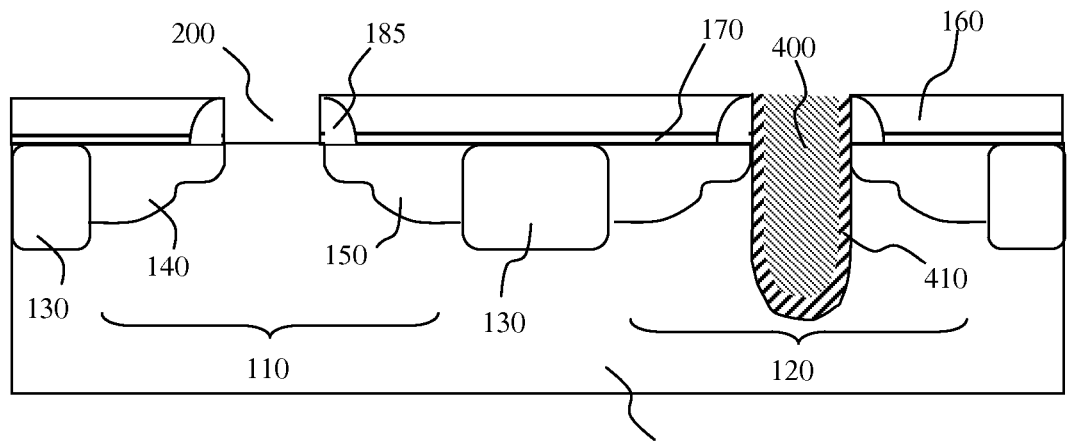
FIG. 9 is a cross-sectional view of a semiconductor substrate having a polysilicon gate of a logic transistor removed to form a recess according to another embodiment.

Next, a logic transistor is formed in logic transistor region 110. Polysilicon layer 180 in logic transistor region 110 is removed so that gate electrode for the logic transistor can be formed. FIG. 9 is a cross-sectional view of a semiconductor substrate having a polysilicon gate of a logic transistor region removed to form a logic recess according to another embodiment. Polysilicon layer 180 in logic transistor region 110 is removed using methods known in the arts such as etching to form logic recess 200. Removal of polysilicon layer 180 in logic transistor region 110 also includes removal gate oxide 190 such that the corresponding surface of substrate 100 is exposed in logic recess 200.

Figure 10:
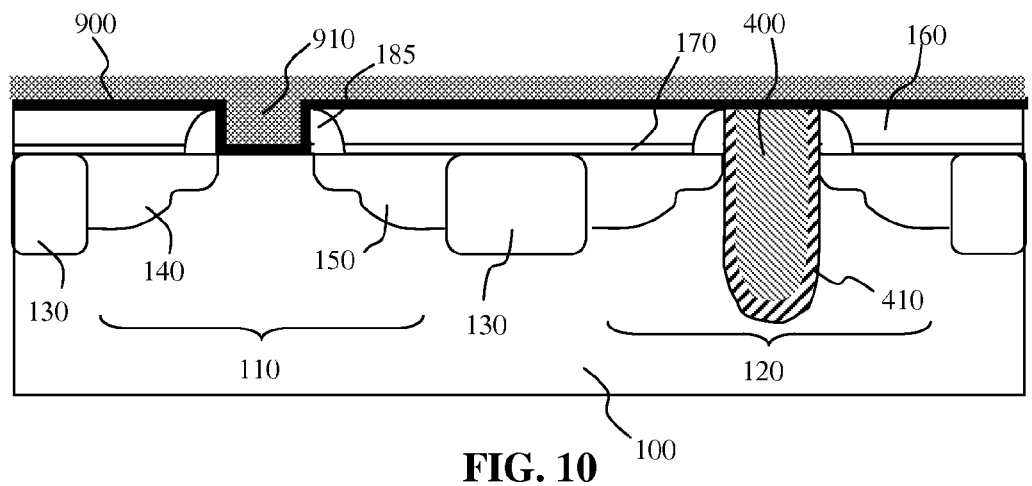
FIG. 10 is a cross-sectional view of a semiconductor substrate having a conformal high-k dielectric layer disposed in a recess of a logic transistor, followed by forming a gate metal in the recess according to another embodiment.

Gate electrode for logic transistor in logic transistor region 110 is formed in logic recess 200 by filling logic recess 200 with high-k dielectric material and gate metal. FIG. 10 is a cross-sectional view of a semiconductor substrate having a logic recess of a logic transistor region disposed with a second conformal high-k dielectric layer and filled with a second gate metal according to another embodiment. Second high-k dielectric layer 900 is conformally deposited at least on the sidewalls of logic recess 200, on the top planar surface of ILD layer 160, and on the top planar surface of first high-k dielectric layer 410, and on first gate metal 400 of recessed channel array transistor in RCAT region 120. Subsequently, second gate metal 910 fills logic recess 200 and forms a conformal layer above second high-k dielectric layer 900.

Next, the top planar surface of substrate 100 is polished to remove the conformal layers of second high-k dielectric 900 and second gate metal 910. The polishing of substrate 100 leaves the top surface of second gate metal 910 planar with ILD layer 160 and the top surface of first gate metal 400.

Figure 11:
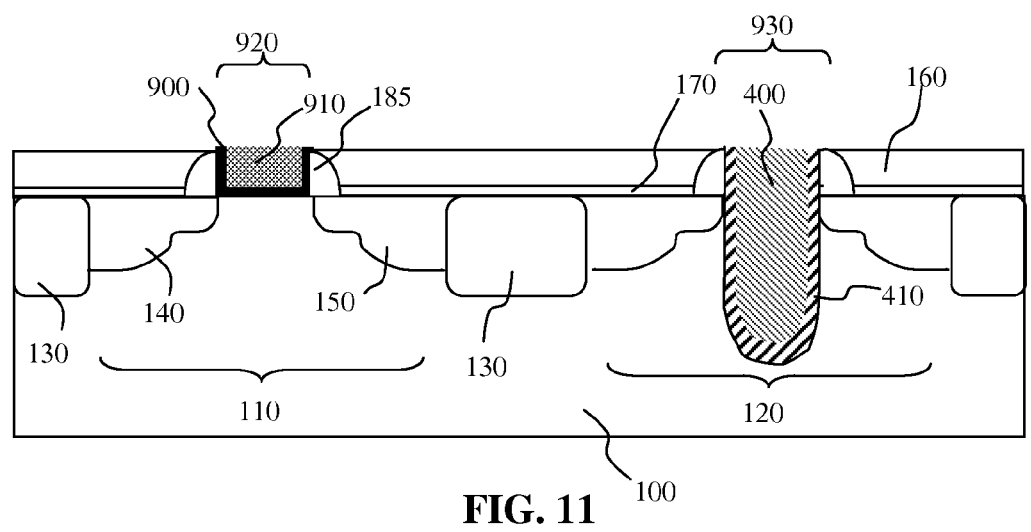
FIG. 11 is a cross-sectional view of a semiconductor substrate having a logic transistor and a recessed channel array transistor (RCAT) fabricated according to another embodiment.

Embodiments described above do not preclude other implementations of the method of fabricating the logic transistors and recessed channel array transistors. Although the above specification describes forming the logic transistor after the recessed channel array transistor (RCAT), alternative embodiments of the invention include first forming the logic transistor and followed by forming, the RCAT. The above specification also describes different embodiments of dielectric layer and gate metal of logic transistors. Dielectric layer of logic transistor and RCAT may be of the same material (as shown in FIG. 5) or different material (as shown in FIG. 11). Gate metal of logic transistor and RCAT may also be of the same material (as shown in FIG. 5) or different material (as shown in FIG. 11). Further embodiments of the invention may include dielectric material of logic transistor and RCAT of the same material but a different material for gate metal. Other embodiments include gate metal for logic transistor and RCAT of the same material but a different material for dielectric layer.

Embodiments of the invention include logic transistors 510 (FIG. 5), 920 (FIG. 11) having a specific layout gate length. Recessed channel array transistors (RCAT) 520 (FIG. 5), 930 (FIG. 11) having layout gate length comparable to the layout gate length of logic transistors 510, 920 include a longer effective layout gate length. The comparable layout gate length of RCAT maintains the layout area consumed by RCAT on surface area of substrate and yet lengthens the channel (gate) length of RCAT.

Embodiments of the invention provide a method to fabricate logic transistors and recessed channel array transistors on a common semiconductor substrate. Devices fabricated according to embodiments of the invention maintain the die surface area requirement while demonstrating improved control of gate length and lower off-current leakage.

In the foregoing specifications reference has been made to specific embodiments of the invention. It will, however be evident that various modifications and changes may be made thereto without departing from the broader spirit and scope of the invention. The specification and drawings are, accordingly, to be regarded in an illustrative rather than restrictive sense.

What is claimed is:

1. A method, comprising:
    forming a first gate bounded on opposing sides thereof by spacers on a first substrate region of a substrate and second gate bound on opposing sides thereof by spacers on a second substrate region of the substrate;
    removing the first gate to form a first recess between the first gate spacers;
    forming a recessed channel by removing the second gate and etching into the substrate below the position of the second gate;
    depositing a first conformal high-k dielectric layer in the first recess;
    depositing a second conformal high-k dielectric layer in the recessed channel;
    filling the first recess with a first gate metal; and
    filling the recessed channel with a second gate metal, wherein the second gate metal is a different gate metal from the first gate metal.

2. The method of claim 1, wherein filling the recessed channel with a second gate metal comprise filing the recessed channel with a second gate metal of a different thickness from the first metal gate.

3. The method of claim 1, wherein depositing the second conformal high-k dielectric layer in the recessed channel comprises depositing a second conformal high-k dielectric layer in the recessed channel of a different thickness from the first conformal high-k dielectric layer.

4. The method of claim 1, wherein depositing a first conformal high-k dielectric layer in the first recess and depositing a second conformal high-k dielectric layer in the recessed channel comprises a continuous process.

5. The method of claim 1, wherein the first substrate region includes a logic transistor having a layout gate length.

6. The method of claim 1, wherein the second substrate region includes an analog transistor or a memory transistor.

7. The method of claim 1, wherein forming the recessed channel comprises forming a recessed channel transistor (RCAT) having an effective gate length longer than the layout gate length.

8. The method of claim 1, further comprising doping the first gate metal with an implant.

9. The method of claim 1, further comprising doping the second gate metal with an implant.

10. The method of claim 1, wherein the first conformal high-k dielectric layer is a different high-k dielectric layer from the second conformal high-k dielectric layer.

11. A method, comprising:
    forming a first gate bounded on opposing sides thereof by spacers on a first substrate region of a substrate and second gate bound on opposing sides thereof by spacers on a second substrate region of the substrate;
    removing the first gate to form a first recess between the first gate spacers;
    forming a recessed channel by removing the second gate and etching into the substrate below the position of the second gate;
    depositing a first conformal high-k dielectric layer in the first recess;
    depositing a second conformal high-k dielectric layer in the recessed channel, wherein the first conformal high-k dielectric layer is a different high-k dielectric layer from the second conformal high-k dielectric layer;
    filling the first recess with a first gate metal; and
    filling the recessed channel with a second gate metal.

12. The method of claim 11, wherein filling the recessed channel with a second gate metal comprises filling the recessed channel with a second gate metal of a different gate metal from the first gate metal.

13. The method of claim 11, wherein filling the recessed channel with a second gate metal comprise filing the recessed channel with a second gate metal of a different thickness from the first metal gate.

14. The method of claim 11, wherein depositing the second conformal high-k dielectric layer in the recessed channel comprises depositing a second conformal high-k dielectric layer in the recessed channel of a different thickness from the first conformal high-k dielectric layer.

15. The method of claim 11, wherein filling the first recess with a first gate metal;
    and filling the recessed channel with a second gate metal comprises a continuous process.

16. The method of claim 11, wherein the first substrate region includes a logic transistor having a layout gate length.

17. The method of claim 11, wherein the second substrate region includes an analog transistor or a memory transistor.

18. The method of claim 11, wherein forming the recessed channel comprises forming a recessed channel transistor (RCAT) having an effective gate length longer than the layout gate length.

19. The method of claim 11, wherein removing the first gate to form the first recess includes removing at least a polysilicon gate and a gate oxide layer.

20. The method of claim 11, wherein forming the recessed channel includes removing at least a polysilicon gate and a gate oxide layer.

* * * * *

UNITED STATES PATENT AND TRADEMARK OFFICE
CERTIFICATE OF CORRECTION

| | | |
|---|---|---|
| PATENT NO. | : 8,030,197 B2 | Page 1 of 1 |
| APPLICATION NO. | : 12/435382 | |
| DATED | : October 4, 2011 | |
| INVENTOR(S) | : Brian S. Doyle et al. | |

It is certified that error appears in the above-identified patent and that said Letters Patent is hereby corrected as shown below:

In column 7, line 24, in claim 2, delete "filing" and insert -- filling --, therefor.

In column 8, line 24, in claim 13, delete "filing" and insert -- filling --, therefor.

Signed and Sealed this
Twenty-seventh Day of December, 2011

David J. Kappos
*Director of the United States Patent and Trademark Office*